(12) United States Patent
Yuasa et al.

(10) Patent No.: US 6,296,494 B1
(45) Date of Patent: Oct. 2, 2001

(54) PRINTED-CIRCUIT MODULE HAVING A PRINTED-CIRCUIT BOARD MOUNTED TO A PRINTING WIRING BOARD

(75) Inventors: Yuichi Yuasa; Tatsuru Iwasa, both of Tokyo (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 0 days.

(21) Appl. No.: 09/689,819

(22) Filed: Oct. 13, 2000

(30) Foreign Application Priority Data

Oct. 15, 1999 (JP) .................................................. 11-293744

(51) Int. Cl.⁷ .................................................. H01R 12/00
(52) U.S. Cl. .................................. 439/67; 439/77; 361/789
(58) Field of Search ................................ 439/67, 77, 492, 439/493, 632, 326; 361/770, 767, 771, 803, 804, 807, 808, 809

(56) References Cited

U.S. PATENT DOCUMENTS

| | | | |
|---|---|---|---|
| 4,468,074 | * | 8/1984 | Gordon .................................. 439/72 |
| 5,018,005 | * | 5/1991 | Lin et al. .......................... 361/398 X |
| 5,313,368 | * | 5/1994 | Volz et al. ........................ 361/767 X |
| 5,479,110 | * | 12/1995 | Crane et al. ........................ 439/67 X |
| 5,586,010 | * | 12/1996 | Murtuza et al. ................. 361/803 X |
| 5,742,484 | * | 4/1998 | Gillette et al. ......................... 361/789 |
| 5,920,465 | * | 7/1999 | Tanaka .............................. 361/493 X |
| 5,969,952 | * | 10/1999 | Hayashi et al. ....................... 361/774 |

* cited by examiner

Primary Examiner—Brian Sircus
Assistant Examiner—Son V. Nguyen
(74) Attorney, Agent, or Firm—Connlly Bove Lodge & Hutz

(57) ABSTRACT

A printed-circuit board module comprises: a flexible printed-circuit (FPC) sheet (25) with its two opposite end portions bent toward the side on which parts (24) are mounted and having connection terminals (29) formed side by side along marginal edges of the bend end portions; a printed-wiring board (22) having an opening (26) for receiving the parts (24) and connecting conductor patterns (27) formed in the neighborhood of the opening (26); and a fixing frame (23). The FPC sheet (25) is fixedly held by the fixing frame (23) and is mounted on the printed-wiring board (22) with the fixing frame (23) held therebetween. The FPC sheet (25) makes direct electrical connections to the printed-wiring board (22), and the amount of extension of the parts (24) into the opening (26) can be adjusted by changing the thickness of the fixing frame (23).

6 Claims, 4 Drawing Sheets

PRINTED-CIRCUIT MODULE HAVING A PRINTED-CIRCUIT BOARD MOUNTED TO A PRINTING WIRING BOARD

BACKGROUND OF THE INVENTION

The present invention relates to a printed-circuit board module of the type in which a printed-wiring board has mounted thereon a smaller printed-circuit board with parts mounted thereon. The "printed-circuit board" mentioned herein is intended as a generic term for a printed-wiring board having a rigid board as of glass epoxy and a flexible printed-circuit sheet having a flexible sheet as of polyimide.

FIG. 4 depicts an example of a conventional printed-circuit board module of this kind. The illustrated example is what is called a board-to-board type module with a printed-wiring board 11 having mounted thereon a smaller printed-wiring board 12.

The printed-wiring board 11 has an opening 13, in which parts (not shown) mounted on the underside of the printed-wiring board 12 are held upside down.

The printed-wiring boards 11 and 12 are electrically connected via pin terminals 14 secured at one ends thereof to the printed-wiring board 12 in side by side relation on the two opposite sides of the printed-wiring board 12. The pin terminals 14 have their other ends bent as required and connected by soldering to connecting conductor pattern lands 15 formed side by side on the printed-wiring board 11. Printed wiring patterns connected the connecting conductor pattern lands 15 are not shown.

The pin terminals 14 thus provide electrical and mechanical connections between the printed-wiring boards 11 and 12.

As described above, the conventional printed-circuit board module uses the pin terminals 14 to establish electrical connections between the printed-wiring boards 11 and 12; therefore, its fabrication involves cumbersome securing of the pin terminals 15 to the printed-wiring board 12 and their manual soldering to the conductor pattern lands 15, and hence it requires a large number of man-hours.

Moreover, since the pin terminals 14 mechanically supporting the printed-wiring board 12 are thin and apt to bend, the board 12 cannot stably be held at a predetermined position (or height).

Furthermore, in this kind of printed-circuit board module it is generally required that the parts mounted on the underside of the printed-wiring board 12 held in the opening 13 do not extend downwardly of the underside of the printed-wiring board 11. Accordingly, there are cases where the lengths and bending of the pin terminals 14 need to be adjusted according to the heights of the parts mounted on the underside of the printed-wiring board 12; and such adjustments of the pin terminals 14 are not easy and are troublesome.

SUMMARY OF THE INVENTION

It is therefore an object of the present invention to provide a printed-circuit board module that is easy to assemble, permits easy adjustment of the amounts of downward extension of the board-mounted parts and is structurally stable as a whole.

According to the present invention, there is provided a printed-circuit board module which comprises: a flexible printed-circuit sheet having parts mounted on its one side and having its two opposite end portions bent toward the part-mounting side (or component side), connection terminals being formed side by side along the marginal edges of the bent end portions; a printed-wiring board having an opening for receiving the parts and connecting conductor pattern lands formed in the vicinity of the opening for connection to the connecting terminals; and a fixing frame. The flexible printed-circuit sheet has the peripheral edge of its component side fixedly supported by the fixing frame mounted on the printed-wiring board around the opening.

DETAILED DESCRIPTION OF THE PREFERRED EMBODIMENTS

With reference to the accompanying drawings, an embodiment of the present invention will be described below.

Figure 1A:
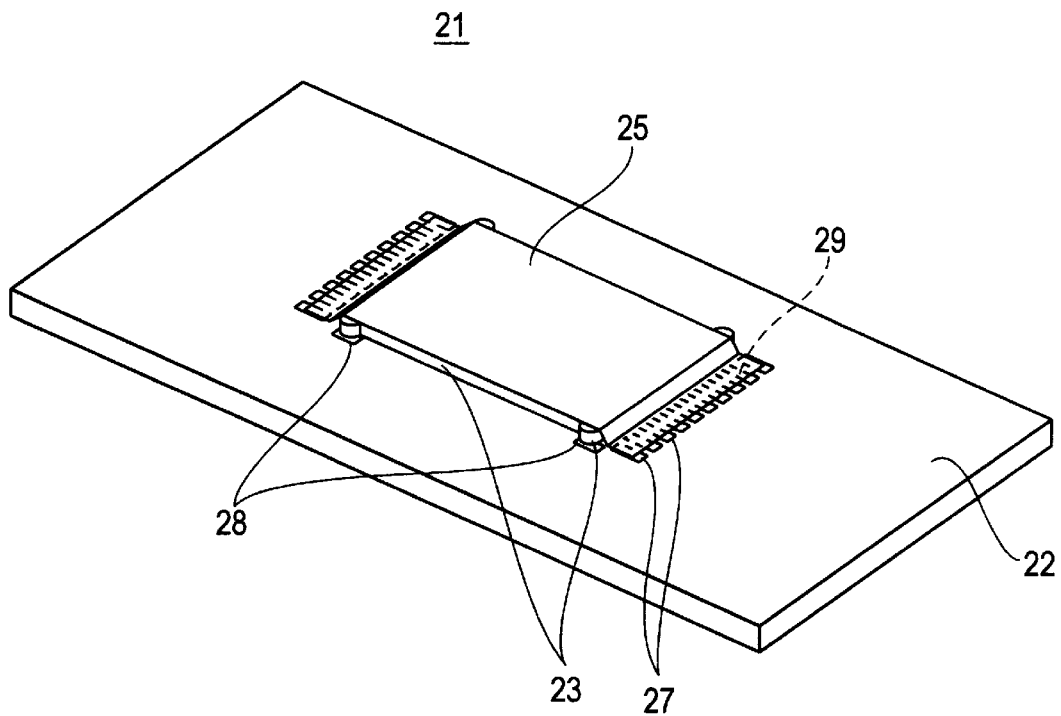
FIG. 1A is a perspective view illustrating an embodiment of the present invention.
Figure 1B:
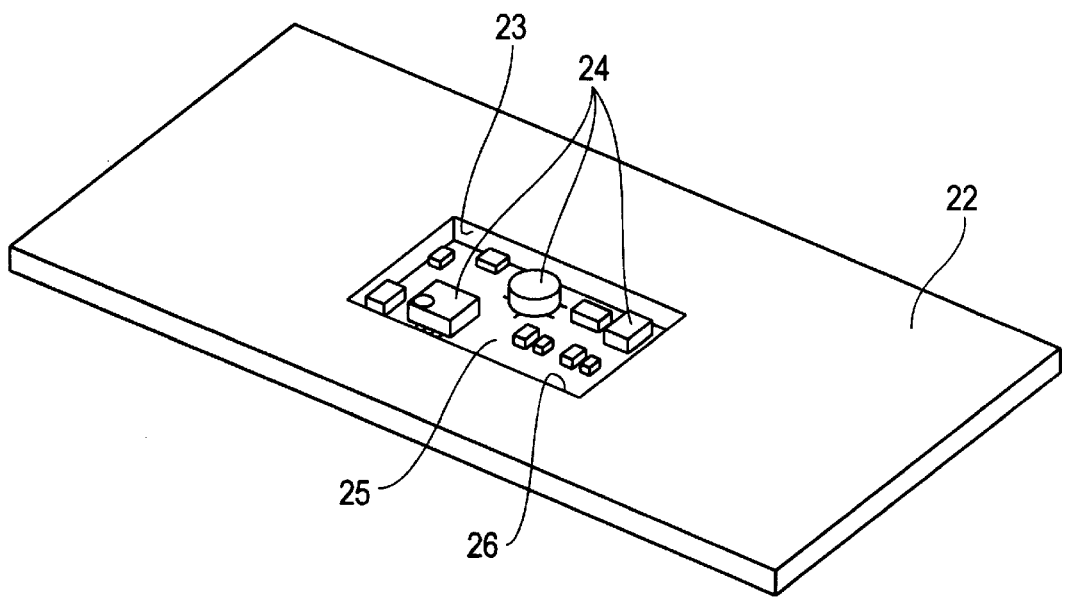
FIG. 1B is its bottom perspective view.
Figure 2:
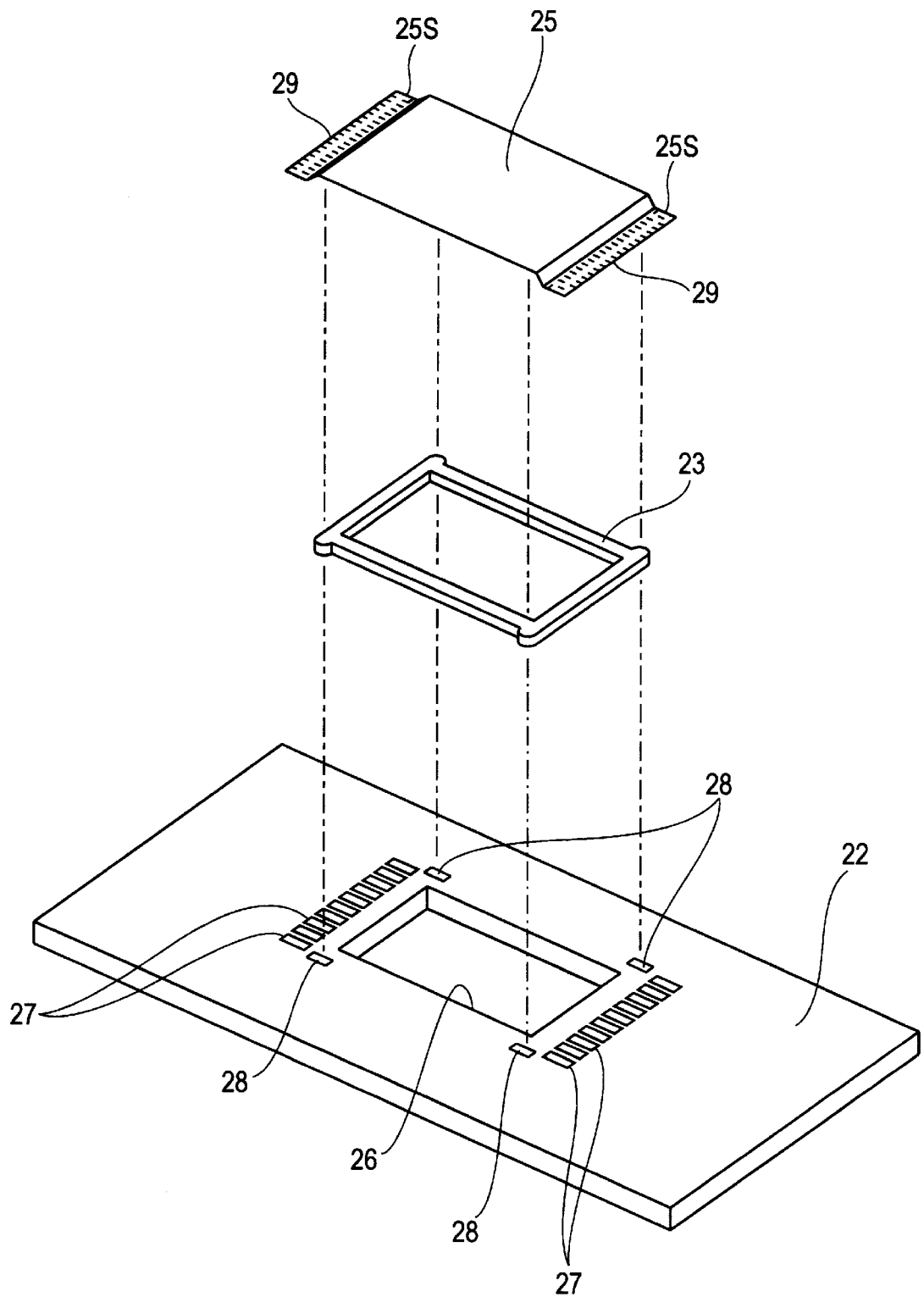
FIG. 2 is its exploded perspective top view.
Figure 3:
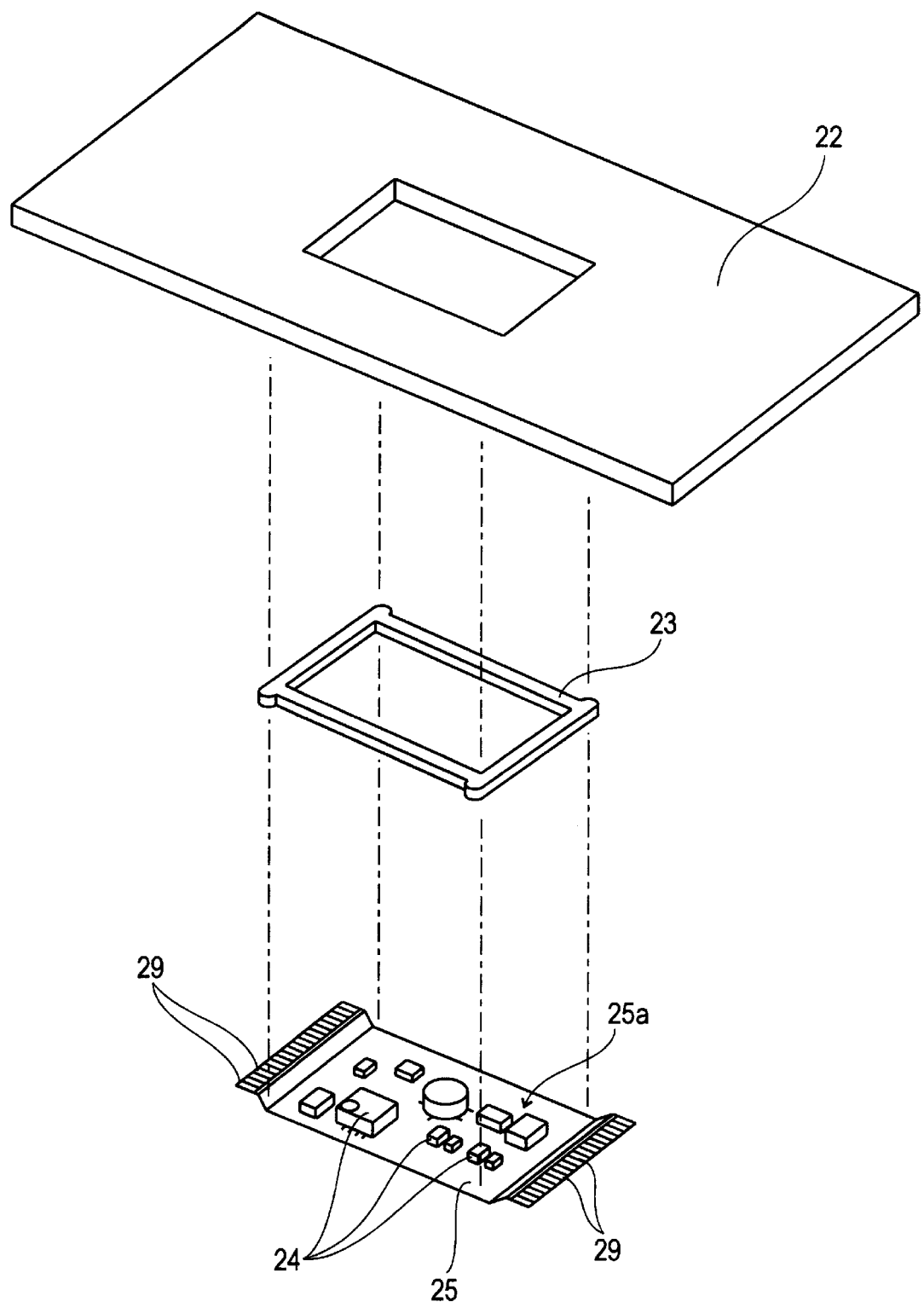
FIG. 3 is an exploded bottom perspective.

FIG. 1A illustrates, in perspective, an embodiment of the present invention, and FIG. 1B is its bottom perspective view. FIGS. 2 and 3 are exploded perspective views of the embodiment, which correspond to FIGS. 1A and 1B, respectively.

In the illustrated embodiment, a printed-circuit board module 21 comprises a printed-wiring board 22, a fixing frame 23 and a flexible printed-circuit sheet (hereinafter referred to as an FPC sheet) 25 with required parts (electronic parts) mounted thereon. That is, the FPC sheet 25 is used as a printed-circuit board that is mounted on the printed-wiring board 22. A description will be given first, with reference to FIGS. 2 and 3, of the respective parts used.

The printed-wiring board 22 has a rectangular opening 26. Formed side by side on the printed-wiring board 22 along two opposed sides of the opening 26 are conductor pattern lands 27 for connection to the FPC sheet 25. In this embodiment, there are formed on the printed-wiring board 22 near four corners of the opening 26 fixing conductor pattern lands 28 for fixing frame 23 by soldering to the board 22.

The fixing frame 23 is a virtually rectangular-shaped frame, which is made of metal in this example.

The FPC sheet 25 of a rectangular configuration has its opposite end portions bent toward its part-mounting surface (i.e. the component side) 25a; furthermore, the bent end portions have their marginal edges bent outward in a manner to extend along the printed-wiring board 22, forming stepped portions 25S on which connecting terminals 29 formed as part of printed circuit (not shown) extend.

In the assembling of the printed-wiring board 22, the fixing frame 23 and the FPC sheet 25 into the printed board module, the FPC sheet 25 with the parts 24 mounted thereon is assembled to the fixing frame 23 first and then the fixing frame 23 having thus secured thereto the FPC sheet 25 is mounted on the printed-wiring board 22.

The FPC sheet 25 and the fixing frame 23 are assembled together using, for instance, double-faced tape, by which the peripheral edge of the part-mounting surface 25a of the FPC board 25 is fixedly secured to the fixing frame 23; that is, the FPC sheet 25 is reinforced by the fixing frame 23.

The fixing frame 23 is placed on the printed-wiring board 22 around the opening 26 and is fixed by soldering to the four fixing conductor lands 28. This is followed by soldering the connection terminals 29 of the FPC sheet 25 to the corresponding conductor pattern lands 27 of the printed-wiring board 22, thereby completing such a printed-circuit board module 21 as shown in FIG. 1. The FPC board 25 is mounted on the printed-wiring board 22 with the fixing frame 23 held therebetween, and the parts 24 mounted on the FPC sheet 25 are received in the opening 26 of the printed-wiring board 22.

Incidentally, the connection terminals 29 of the FPC sheet 25 can be soldered at one time to the conductor pattern lands 27 of the printed-wiring board 22 by preapplying solder to one or both of the connection terminals 29 and the conductor pattern lands 27 and then by performing pulse-heating from the side of base film (i.e. the non-component side) of the FPC sheet 25.

With the printed-circuit board module 21 of the above construction, the pc sheet 25, which is mounted on the printed-wiring board 22, is flexible as referred to previously, and hence it can be bent to establish direct electrical connections to the printed-wiring board 22 and, at the same time, the connection terminals 29 can collectively be soldered to the conductor pattern lands 27.

The amount of extension of the parts 24, that is, the height of the FPC sheet 25, can easily be adjusted according to the heights of the parts 24 by merely changing the thickness of the fixing frame 23.

The FPC sheet 25 is held by the fixing frame 23 and is mounted on the printed-wiring board 22 through the frame 23. Accordingly, the FPC sheet 25 is protected from bending and deformation, and hence it is structurally stable.

While in the above the fixing frame 23 has been described to be made of metal, it may also be made of plastic or resin, in which case an adhesive is used to bond it to the printed-wiring board 22.

Furthermore, the connection terminals 29 of the FPC sheet 25 are supported on its base film as depicted in FIGS. 1 to 3, but it is also possible to remove the base film from the area of arrangement of the connection terminals 29 so that they merely project out of the base film.

EFFECT OF THE INVENTION

Figure 4:
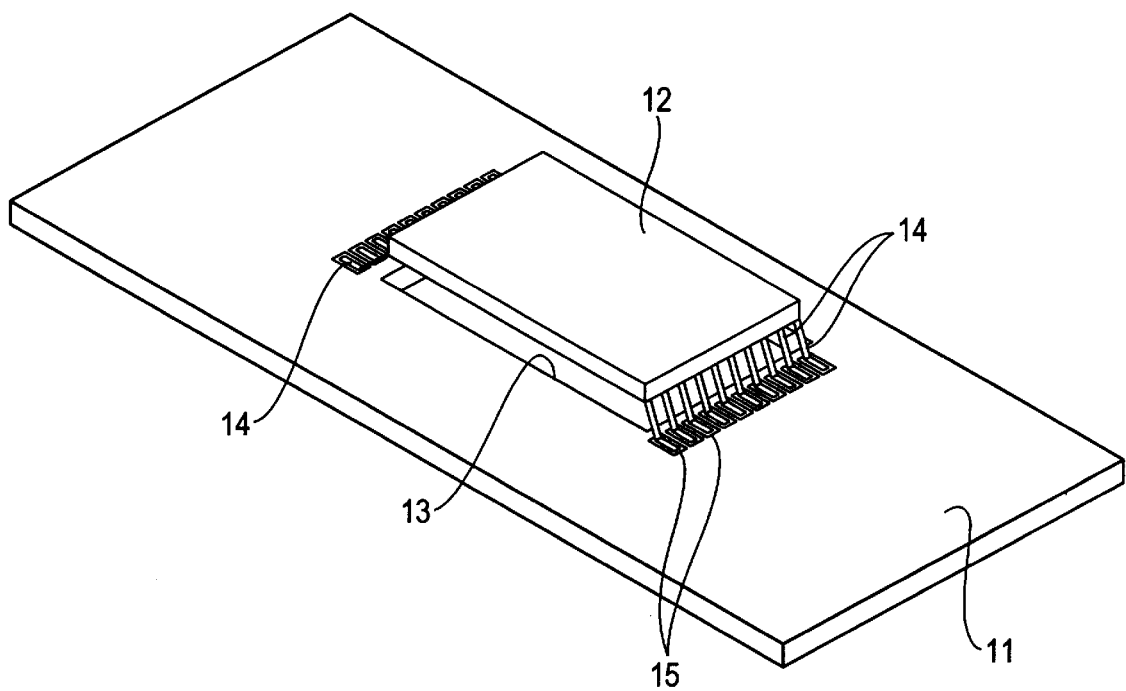
FIG. 4 is a perspective view depicting a conventional printed-circuit board module.

As described above, according to the present invention, since the flexible printed-circuit (FPC) sheet 25 is mounted on the printed-wiring board 22, electrical connections between them can be directly made without using the pin terminals 14 as in the case of the conventional printed board module depicted in FIG. 4—this allows ease in the assembling of the printed board module.

The amount of extension of the parts 24 mounted on the flexible printed-circuit sheet 25 can easily be adjusted by changing the thickness of the fixing frame 23. Moreover, the flexible printed-circuit sheet 25 is reinforced and held by the fixing frame and is mechanically coupled to the printed-wiring board 22 through the fixing frame 23, and hence it is mechanically robust and stable.

Besides, since the flexible printed-circuit sheet 25 is mechanically fixed by the fixing frame 23 to the printed-wiring board 22, the arrangement of the connection terminals 29 can be determined by the condition of their electrical connections alone, that is, the connection terminals 29 may also be placed along only one side of the flexible printed-circuit sheet 25—this provides increased flexibility in the arrangement of the connection terminals 29.

It will be apparent that many modifications and variations may be effected without departing from the scope of the novel concepts of the present invention.

What is claimed is:

1. A printed-circuit board module comprising:
   a flexible printed-circuit sheet with electronic parts mounted on one side thereof and connection terminals formed side by side along two opposite marginal portions thereof;
   a printed-wiring board having an opening for receiving said electronic parts and connecting conductor pattern lands formed side by side near two opposite sides of said opening in opposing relation to said connection terminals of said flexible printed-circuit sheet; and
   a fixing frame fixedly mounted on said printed-wiring board around said opening;
   wherein said flexible printed-circuit sheet is opposed to said printed-wiring board with said fixing frame held therebetween and said two opposite marginal portions are bent toward said printed-wiring board along two opposite sides of said fixing frame so that said connection terminals of said flexible printed-circuit sheet are fixedly connected to said connecting conductor pattern lands of said printed-wiring board.

2. The printed-circuit board module of claim 1, wherein said flexible printed-circuit sheet is substantially a parallelogram and said connection terminals are print-wired side by side along said two opposite marginal portions of said flexible printed-circuit sheet, said opening having a substantially parallelogram shape.

3. The printed-circuit board module of claim 2, wherein said connection terminals and said connecting conductor pattern lands are fixedly soldered to each other.

4. The printed-circuit board module of claim 2 or 3, wherein said fixing frame is made of metal.

5. The printed-circuit board module of claim 4, wherein said printed-wiring board has fixing conductor pattern lands formed adjacent corners of said opening in opposing relation to said fixing frame, said fixing conductor pattern lands being formed of the same material as said connecting conductor pattern lands simultaneously therewith by patterning, and said fixing frame is fixedly soldered to said fixing pattern lands.

6. The printed-circuit board module of claim 2 or 3, wherein said fixing frame is made of plastic and is bonded by an adhesive to said printed-wiring board.

* * * * *